United States Patent
Jeon et al.

(10) Patent No.: US 8,816,459 B2
(45) Date of Patent: Aug. 26, 2014

(54) IMAGE SENSOR HAVING WAVE GUIDE AND METHOD FOR MANUFACTURING THE SAME

(75) Inventors: In-Gyun Jeon, Seongnam-si (KR); Se-Jung Oh, Seoul (KR); Heui-Gyun Ahn, Seongnam-si (KR); Jun-Ho Won, Seoul (KR)

(73) Assignee: Siliconfile Technologies Inc., Seoul (KR)

( * ) Notice: Subject to any disclaimer, the term of this patent is extended or adjusted under 35 U.S.C. 154(b) by 162 days.

(21) Appl. No.: 13/563,620

(22) Filed: Jul. 31, 2012

(65) Prior Publication Data

US 2012/0295389 A1 Nov. 22, 2012

Related U.S. Application Data

(62) Division of application No. 12/758,646, filed on Apr. 12, 2010, now Pat. No. 8,368,158.

(30) Foreign Application Priority Data

Apr. 17, 2009 (KR) .................. 10-2009-0033400

(51) Int. Cl.
*H01L 31/0232* (2014.01)
*H01L 27/146* (2006.01)

(52) U.S. Cl.
CPC .... *H01L 27/14627* (2013.01); *H01L 27/14687* (2013.01); *H01L 27/14632* (2013.01); *H01L 27/14643* (2013.01); *H01L 27/14621* (2013.01); *H01L 27/14685* (2013.01)
USPC ........... 257/432; 257/428; 257/414; 257/431; 257/436; 257/437; 257/440; 257/443; 257/444; 257/461; 257/E31.127; 257/E31.093

(58) Field of Classification Search
None
See application file for complete search history.

(56) References Cited

U.S. PATENT DOCUMENTS

| | | | |
|---|---|---|---|
| 2003/0025160 A1* | 2/2003 | Suzuki et al. | 257/347 |
| 2003/0214595 A1* | 11/2003 | Mabuchi | 348/294 |
| 2006/0113622 A1* | 6/2006 | Adkisson et al. | 257/443 |
| 2006/0278896 A1* | 12/2006 | Inoue | 257/215 |
| 2007/0072326 A1* | 3/2007 | Zheng et al. | 438/48 |
| 2008/0246064 A1* | 10/2008 | Kimura | 257/292 |
| 2009/0108390 A1* | 4/2009 | Lee | 257/446 |

* cited by examiner

*Primary Examiner* — Fei Fei Yeung Lopez
(74) *Attorney, Agent, or Firm* — Kile Park Reed & Houtteman PLLC

(57) ABSTRACT

An image sensor having a wave guide includes a semiconductor substrate formed with a photodiode and a peripheral circuit region; an anti-reflective layer formed on the semiconductor substrate; an insulation layer formed on the anti-reflective layer; a wiring layer formed on the insulation layer and connected to the semiconductor substrate; at least one interlayer dielectric stacked on the wiring layer; and a wave guide connected to the insulation layer by passing through the interlayer dielectric and the wiring layer which are formed over the photodiode.

9 Claims, 5 Drawing Sheets

IMAGE SENSOR HAVING WAVE GUIDE AND METHOD FOR MANUFACTURING THE SAME

CROSS REFERENCE TO RELATED APPLICATIONS

This application is a divisional application of U.S. patent application Ser. No. 12/758,646, filed on Apr. 12, 2010, the disclosure of which is herein incorporated by reference in its entirety. The U.S. patent application Ser. No. 12/758,646 claims priority to Korean Application No. 10-2009-0033400 filed on Apr. 17, 2009, the entire contents of which are incorporated herein by reference.

BACKGROUND OF THE INVENTION

1. Field of the Invention

The present invention relates to an image sensor having a wave guide as a traveling path of incident light and a method for manufacturing the same, and more particularly, to an image sensor having a wave guide, in which a separate wiring layer is formed over a photodiode so that etching uniformity is secured and the generation of dark current by plasma ions during an etching process is prevented when forming a wave guide through etching, and a method for manufacturing the same.

2. Description of the Related Art

Image sensors are semiconductor devices which convert an optical image into electrical signals. Representative image sensors include a charge coupled device (CCD) and a CMOS image sensor.

Between these two image sensors, the CMOS image sensor stands for a device which converts an optical image into electrical signals using a CMOS manufacturing technology. The CMOS image sensor adopts a switching scheme in which MOS transistors are formed by the number of pixels and outputs are sequentially detected using the CMOS transistors.

When compared to the CCD image sensor which has been widely used heretofore as an image sensor, in the CMOS image sensor, a simple driving scheme is used, and various scanning schemes can be realized. Further, since a signal processing circuit can be integrated in a single chip, miniaturization of a product is made possible, and since a compatible CMOS technology is employed, the manufacturing cost can be reduced and the power consumption can be significantly decreased.

The CMOS image sensor is composed of a photodiode which detects light and a CMOS logic circuit which converts detected light into an electrical signal as data. In order to improve the light sensitivity of the image sensor, efforts have been made to increase a ratio between the area of the photodiode and the area of the entire image sensor (that is usually called a fill factor). However, because the CMOS logic circuit cannot be omitted, difficulties necessarily exist in increasing the ratio.

Under these situations, light condensing technologies have been disclosed in the art, in which paths of light incident on points other than the photodiode are changed to be directed toward the photodiode so as to elevate the light sensitivity. Representative technologies include a microlens forming technology and a technology using a wave guide.

In the case where light is condensed using a microlens, as the number of integrated pixels increases these days, the distance between the microlens and the photodiode disposed under the microlens increases gradually as well. Due to this face, since a focus cannot be formed on the photodiode, a problem is caused in that light having passed through the microlens cannot be effectively transferred to the photodiode.

Meanwhile, research has been directed toward the technology for providing a wave guide in the traveling path of incident light and allowing light incident on the photodiode to pass through the wave guide, thereby minimizing the loss of incident light and suppressing a crosstalk between adjacent pixels.

FIG. 1 is a cross-sectional view illustrating a conventional image sensor having a wave guide.

Referring to FIG. 1, it can be seen that a conventional image sensor having a wave guide is configured in such a way that an interlayer dielectric 16 formed over a photodiode 11 is etched and a wave guide 19 is formed thereby.

However, in the conventional image sensor having a wave guide, since an amount of the interlayer dielectric 16 to be etched when forming the wave guide 19 is considerable and an etching depth is substantial, etching uniformity cannot be secured. Such non-uniformity leads to the non-uniformity of the photodiode 11, whereby the characteristics of the image sensor are likely to deteriorate.

Also, an amount of plasma ions needed in an etching process for forming the wave guide 19 increases, and a portion of the plasma ions is introduced into the photodiode 11 and serves as a factor for causing a defect in the photodiode 11, whereby the characteristics of the entire image sensor are likely to further deteriorate.

SUMMARY OF THE INVENTION

Accordingly, the present invention has been made in an effort to solve the problems occurring in the related art, and an object of the present invention is to provide an image sensor having a wave guide, in which a wiring layer is formed over a photodiode such that the wiring layer can be used as an etch stop layer in the course of forming a wave guide so that non-uniformity in etching depth can be avoided and such that the plasma-charge ions generated in an etching process can be discharged to a semiconductor substrate so that introduction of the plasma-charged ions into the photodiode can be prevented and the generation of dark current can be suppressed, and a method for manufacturing the same.

In order to achieve the above object, according to one aspect of the present invention, there is provided an image sensor having a wave guide, comprising a semiconductor substrate formed with a photodiode and a peripheral circuit region; an anti-reflective layer formed on the semiconductor substrate; an insulation layer formed on the anti-reflective layer; a wiring layer formed on the insulation layer and connected to the semiconductor substrate; at least one interlayer dielectric stacked on the wiring layer; and a wave guide connected to the insulation layer by passing through the interlayer dielectric and the wiring layer which are formed over the photodiode.

In order to achieve the above object, according to another aspect of the present invention, there is provided a method for manufacturing an image sensor having a wave guide, comprising the steps of (a) forming an anti-reflective layer on a semiconductor substrate which is formed with a photodiode and a peripheral circuit region; (b) forming an insulation layer on the anti-reflective layer; (c) forming a wiring layer on the insulation layer; (d) forming at least one interlayer dielectric on the wiring layer; (e) selectively etching the interlayer dielectric until the wiring layer is exposed, so as to form a wave guide over the photodiode; and (f) selectively etching the wiring layer exposed in the step (e) until the insulation layer formed over the photodiode is exposed.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
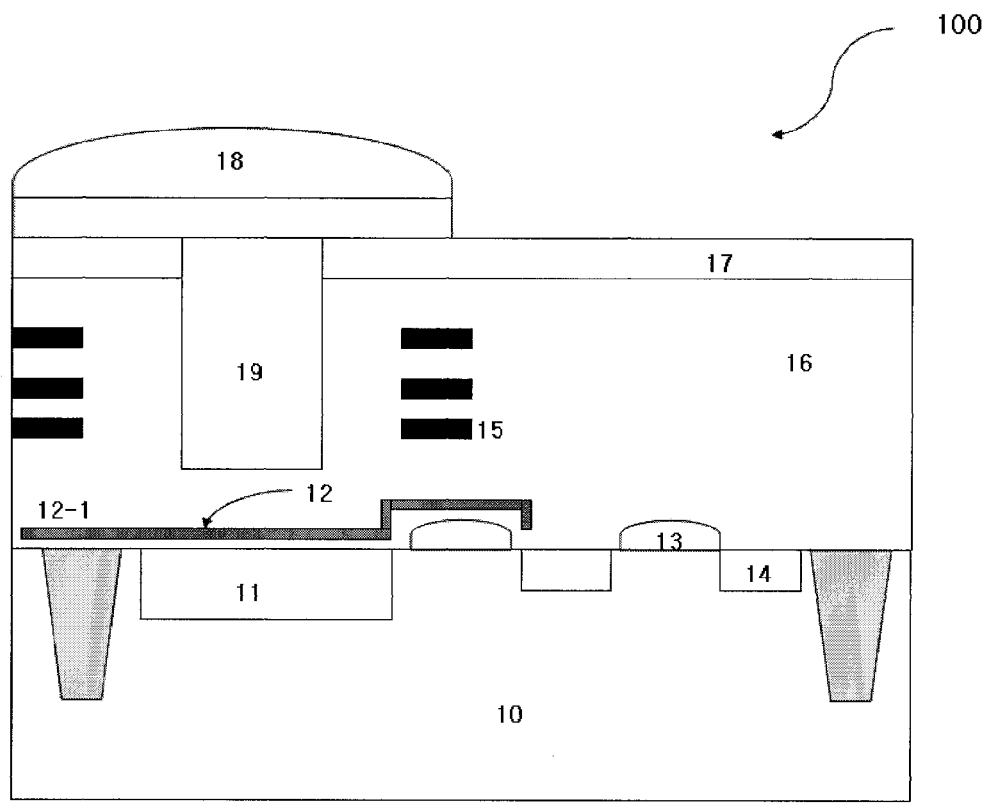
FIG. 1 is a cross-sectional view illustrating a conventional image sensor having a wave guide.

Reference will now be made in greater detail to preferred embodiments of the invention, examples of which are illustrated in the accompanying drawings. Wherever possible, the same reference numerals will be used throughout the drawings and the description to refer to the same or like parts.

Figure 2:
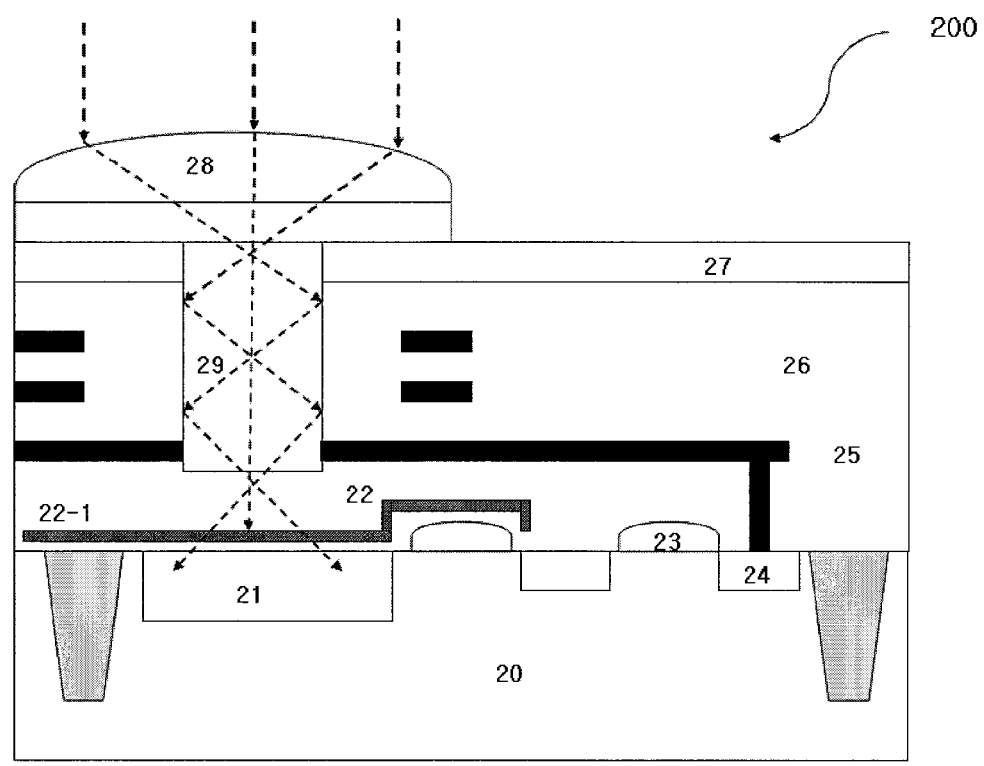
FIG. 2 is a cross-sectional view illustrating an image sensor having a wave guide in accordance with an embodiment of the present invention.

FIG. 2 is a cross-sectional view illustrating an image sensor having a wave guide in accordance with an embodiment of the present invention.

Referring to FIG. 2, an image sensor 200 having a wave guide in accordance with an embodiment of the present invention includes a semiconductor substrate 20, an anti-reflective layer 22, an insulation layer 22-1, a wiring layer 25, an interlayer dielectric 26, and a wave guide 29.

A photodiode 21 and a peripheral circuit region are formed in the semiconductor substrate 20. Since the photodiode 21 and the peripheral circuit region formed in the semiconductor substrate 20 are the same as those of the conventional CMOS image sensor, detailed description thereof will be omitted herein.

The anti-reflective layer 22 is formed on the semiconductor substrate 20, the insulation layer 22-1 is formed on the anti-reflective layer 22, and the wiring layer 25 is formed on the insulation layer 22-1. It is preferred that the wiring layer 25 be formed of a material such as tungsten (W), aluminum (Al), titanium (Ti) and silicon nitride (SiN).

The wiring layer 25 is connected to a well 24 which is formed in the semiconductor substrate 20. In the case where the semiconductor substrate 20 is a P type substrate, the well 24 is formed through N+/P junction, and in the case where the semiconductor substrate 20 is an N type substrate, the well 24 is formed through P+/N junction.

At least one interlayer dielectric 26 is stacked on the wiring layer 25, and preferably, a passivation layer 27 is further formed on the uppermost interlayer dielectric 26. The wave guide 29 is formed through the wiring layer 25, the interlayer dielectric 26 and the passivation layer 27 until it reaches the insulation layer 22-1 which is formed over the photodiode 21.

A color filter is formed on the passivation layer 27 through which the wave guide 29 passes, and a microlens 28 is formed on the color filter so that light condensing efficiency is improved.

As shown in FIG. 2, in the image sensor 200 having a wave guide in accordance with the embodiment of the present invention, after light having passed through the microlens 28 and the color filter is incident on the wave guide 29, the incident light is totally reflected in the wave guide 29 by the substance contained in the wave guide 29, and is transferred to the photodiode 21 while the loss of the incident light is minimized.

Due to the fact that the wiring layer 25 is connected to the well 24, a large amount of plasma-charged ions, which are produced in the course of forming the wave guide 29, are not introduced into the photodiode 21 and are discharged to the semiconductor substrate 20 through the well 24, whereby advantages are provided in that the characteristics of the photodiode 21 can be improved.

Figure 3:
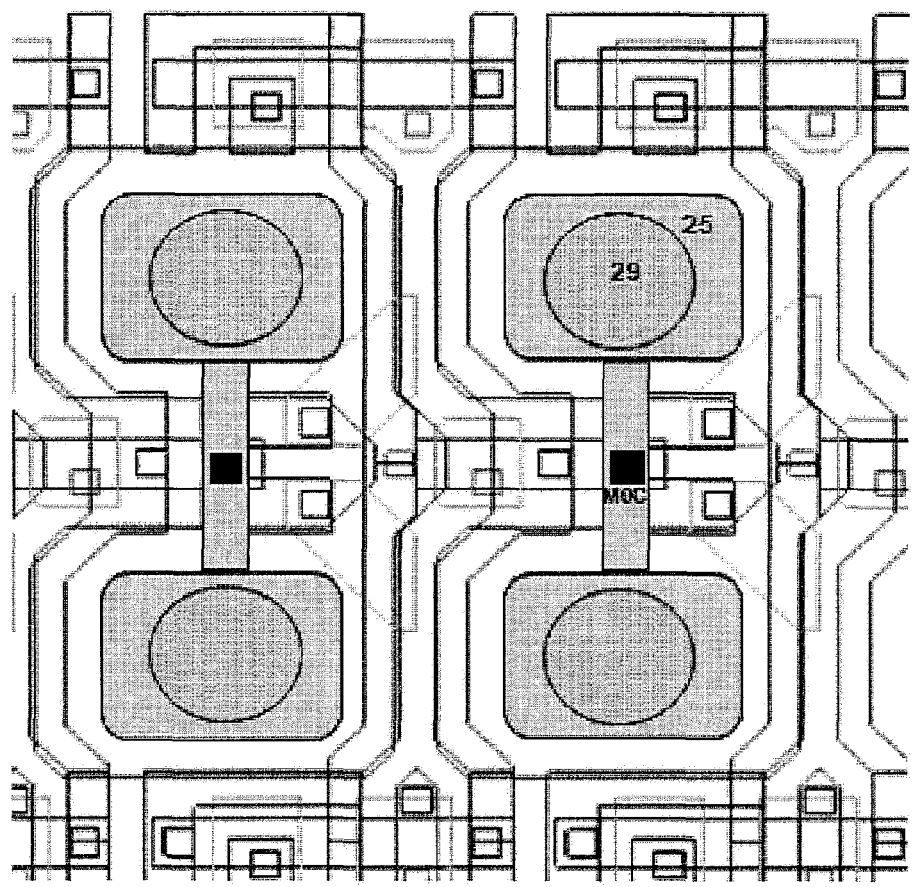
FIG. 3 is a plan view illustrating the image sensor having a wave guide in accordance with the embodiment of the present invention.

FIG. 3 is a plan view illustrating the image sensor having a wave guide in accordance with the embodiment of the present invention.

Referring to FIG. 3, in the image sensor 200 having a wave guide in accordance with the embodiment of the present invention, it can be seen that the wiring layer 25 including an opening for the wave guide 29 is formed over the photodiode 21 and is connected to the lower N+/P type or P+/N type well which is formed in the semiconductor substrate 20.

Figure 4:
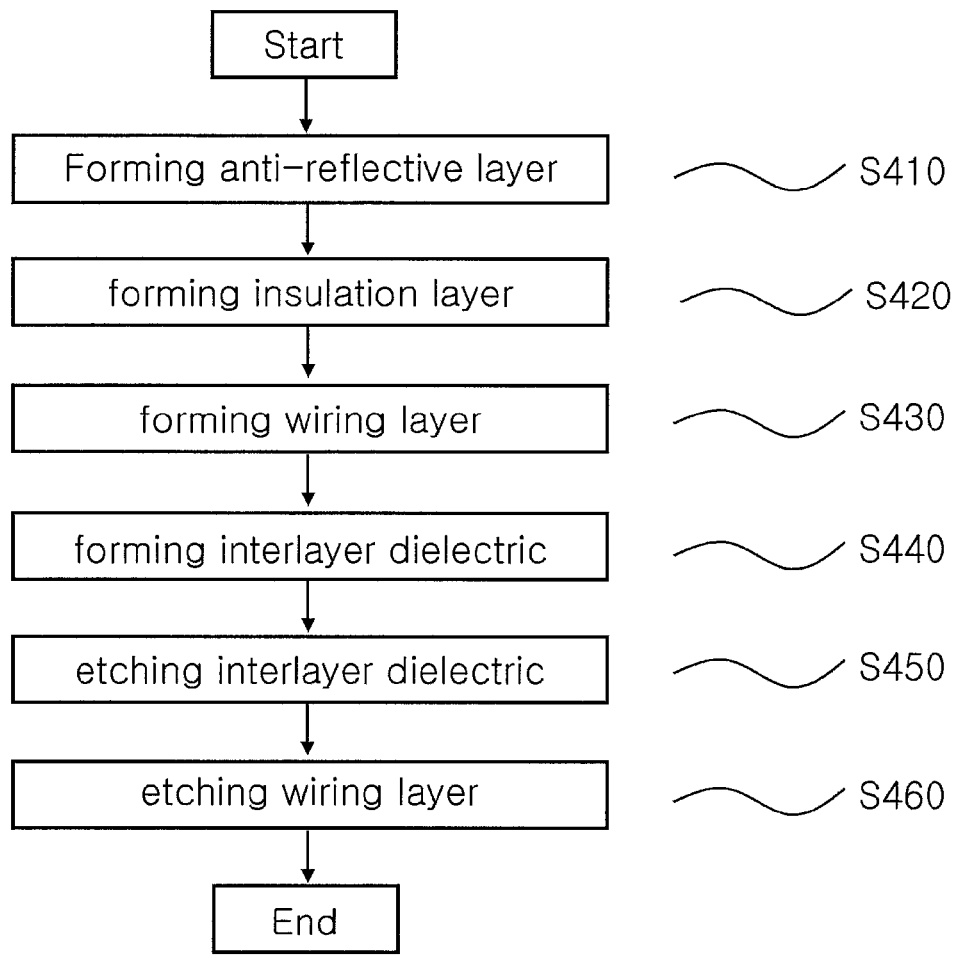
FIG. 4 is a flow chart illustrating a method for manufacturing an image sensor having a wave guide in accordance with another embodiment of the present invention.

FIG. 4 is a flow chart illustrating a method for manufacturing an image sensor having a wave guide in accordance with another embodiment of the present invention.

Referring to FIG. 4, a method for manufacturing an image sensor having a wave guide in accordance with another embodiment of the present invention includes an anti-reflective layer forming step S410, an insulation layer forming step S420, a wiring layer forming step S430, an interlayer dielectric forming step S440, an interlayer dielectric etching step S450, and a wiring layer etching step S460.

In the anti-reflective layer forming step S410, the anti-reflective layer 22 is formed on the semiconductor substrate 20 which is formed with the photodiode 21 and the peripheral circuit region. Then, the insulation layer 22-1 is formed on the anti-reflective layer 22 for an insulation purpose (S420).

In the wiring layer forming step S430, the wiring layer 25 is formed on the insulation layer 22-1. The wiring layer 25 is connected to the well 24 which is formed in the semiconductor substrate 20, so that the large amount of plasma-charged ions produced in the process of forming the wave guide 29 are not introduced into the photodiode 21 and are discharged to the semiconductor substrate 20 through the well 24.

In the interlayer dielectric forming step S440, at least one interlayer dielectric 26 is formed on the wiring layer 25. Preferably, the passivation layer 27 is formed on the uppermost interlayer dielectric 26.

In the interlayer dielectric etching step S450, in order to form the wave guide 29 over the photodiode 21, the interlayer dielectric 26 and the passivation layer 27 are selectively etched.

Thereupon, the wiring layer etching step S460 is conducted, in which the wiring layer 25 exposed in the interlayer dielectric etching step S450 is selectively etched until the insulation layer 22-1 formed over the photodiode 21 is exposed.

After the opening for the wave guide 29 is defined, preferably, steps of forming the color filter and the microlens 28 on the passivation layer 27 are conducted.

Meanwhile, by selectively etching a portion of the insulation layer 22-1 exposed in the wiring layer etching step S460 as the occasion demands, the loss of light incident on the photodiode 21 can be further reduced.

An essential idea of the present invention resides in that a wiring layer is formed in advance over a photodiode before forming a wave guide, in such a way as to be connected to a well of N+/P type or P+/N type, so that the plasma-charged ions produced in a process of forming the wave guide are discharged to a semiconductor substrate through the well of N+/P type or P+/N type, thereby preventing the plasma-charged ions from being introduced into the photodiode.

As the wiring layer formed in advance over the photodiode serves as an etch stop layer in a process of forming the wave guide, it is possible to etch the wave guide formed over the photodiode to have a uniform open depth. Thereafter, as the wiring layer having served as the etch stop layer is etched to define the wave guide, an opening procedure for forming the wave guide is completed.

That is to say, after the opening procedure is conducted for an interlayer dielectric through etching until the wiring layer is exposed, by further opening the wiring layer having served as the etch stop layer, the opening procedure for the formation of the wave guide is completed.

Figure 5:
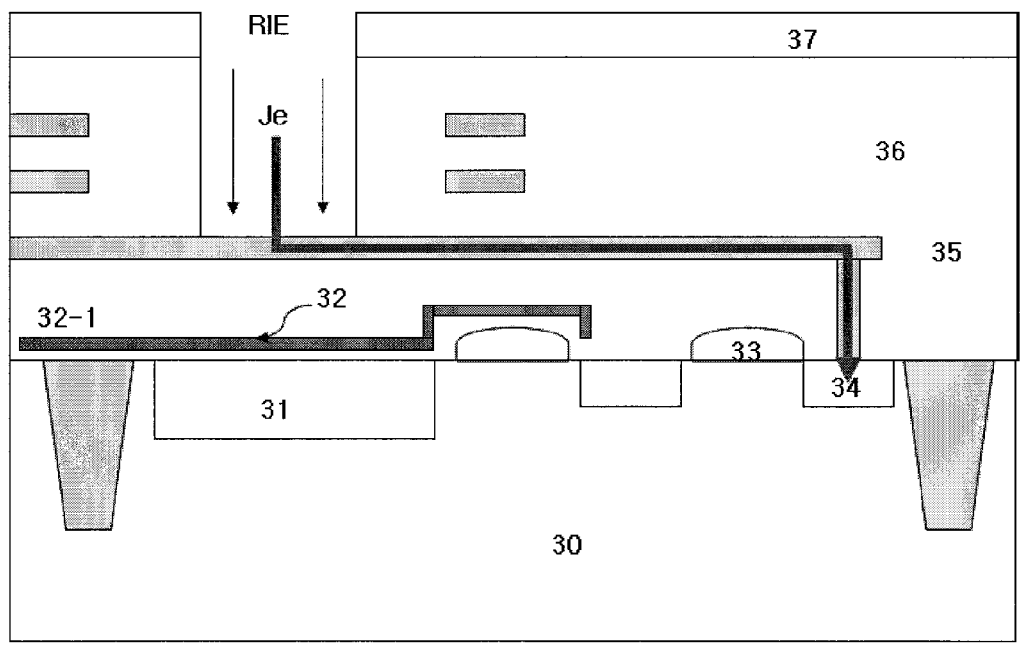
FIG. 5 is a cross-sectional view illustrating a state in which plasma-charged ions are discharged through a wiring layer to a semiconductor substrate during a process for manufacturing the image sensor having a wave guide according to the present invention.

FIG. 5 is a cross-sectional view illustrating a state in which plasma-charged ions are discharged through a wiring layer to a semiconductor substrate during a process for manufacturing the image sensor having a wave guide according to the present invention.

Referring to FIG. 5, it can be seen that the plasma-charged ions produced in the procedure of opening a wave guide are not introduced into a photodiode 31 and are discharged to a semiconductor substrate 30 through a well 34 of N+/P type or P+/N type.

As is apparent from the above description, the image sensor having a wave guide and the method for manufacturing the same according to the present invention provide advantages in that, since a wiring layer is formed over a photodiode and is used as an etch stop layer in the course of forming a wave guide, non-uniformity in etching depth can be avoided and due to this fact, the imaging characteristics of the photodiode can be improved.

Also, since the plasma-charged ions used in an etching process are discharged to a semiconductor substrate through a wiring layer, the introduction of a source which is likely to cause a defect in the photodiode can be prevented, whereby generation of dark current can be suppressed.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. A method for manufacturing an image sensor having a wave guide, comprising the steps of:
 (a) forming an anti-reflective layer on a semiconductor substrate which is formed with a photodiode and a peripheral circuit region;
 (b) forming an insulation layer on the anti-reflective layer;
 (c) forming a conductive wiring layer on the insulation layer;
 (d) forming at least one interlayer dielectric on the wiring layer;
 (e) selectively etching the interlayer dielectric until the wiring layer, is exposed, so as to form a wave guide over the photodiode; and
 (f) selectively etching the wiring layer exposed in the step (e) until a portion of the insulation layer formed over the photodiode is exposed;
 wherein the wiring layer provides a conductor that allows plasma-charged ions in the wave guide to be discharged into the semiconductor substrate and not be introduced into the photodiode.

2. The method according to claim 1, wherein the step (c) comprises the step of:
 (c1) connecting the wiring layer to a well which is formed in the semiconductor substrate.

3. The method according to claim 2, wherein the step (d) comprises the step of:
 (d1) forming a passivation layer on an uppermost interlayer dielectric.

4. The method according to claim 2, wherein the well is formed through N+/P junction when the semiconductor substrate is a P type substrate, and is formed through P+/N junction when the semiconductor substrate is an N type substrate.

5. The method according to claim 2, wherein, in the step (c), the wiring layer is formed using tungsten (W), aluminum (Al), or titanium (Ti).

6. The method according to claim 2, further comprising the step of:
 (g) etching a portion of the insulation layer exposed in the wiring layer etching step.

7. The method according to claim 2, further comprising the steps of:
 (h) forming a color filter on the passivation layer; and
 (i) forming a microlens on the color filter.

8. The method according to claim 1, wherein the wiring layer acts as a etch stop layer in the course of forming a wave guide so that non-uniformity in etching depth can be avoided.

9. The method according to claim 2, wherein the wiring layer allows plasma-charged ions in the wave guide to be discharged into the semiconductor substrate via the well formed in the semiconductor substrate.

* * * * *